(12) United States Patent
Yoneguchi et al.

(10) Patent No.: US 9,455,238 B2
(45) Date of Patent: Sep. 27, 2016

(54) POWER CONVERTER

(71) Applicant: HONDA MOTOR CO., LTD., Tokyo (JP)

(72) Inventors: Asako Yoneguchi, Wako (JP); Toshitake Ohnishi, Wako (JP); Yasuhiro Maeda, Wako (JP); Hitoshi Nishio, Wako (JP); Yoshinobu Suhara, Wako (JP); Ryo Imagawa, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/223,994

(22) Filed: Mar. 24, 2014

(65) Prior Publication Data

US 2014/0284809 A1     Sep. 25, 2014

(30) Foreign Application Priority Data

Mar. 25, 2013 (JP) ................................. 2013-061255

(51) Int. Cl.
*H01L 23/48* (2006.01)
*H01L 23/52* (2006.01)
*H01L 29/40* (2006.01)
*H01L 23/00* (2006.01)

(52) U.S. Cl.
CPC .............. *H01L 24/13* (2013.01); *H01L 24/37* (2013.01); *H01L 24/40* (2013.01); *H01L 24/73* (2013.01); *H01L 24/29* (2013.01); *H01L 24/32* (2013.01); *H01L 24/48* (2013.01); *H01L 24/49* (2013.01); *H01L 24/75* (2013.01); *H01L 24/77* (2013.01); *H01L 24/83* (2013.01); *H01L 24/84* (2013.01); *H01L 2224/29101* (2013.01); *H01L 2224/32225* (2013.01); *H01L 2224/37013* (2013.01); *H01L 2224/4007* (2013.01); *H01L 2224/40095* (2013.01); *H01L 2224/40137* (2013.01); *H01L 2224/40139* (2013.01); *H01L 2224/48091* (2013.01); *H01L 2224/49175* (2013.01); *H01L 2224/73221* (2013.01); *H01L 2224/73263* (2013.01); *H01L 2224/73265* (2013.01); *H01L 2224/75272* (2013.01); *H01L 2224/77272* (2013.01); *H01L 2224/83815* (2013.01); *H01L2224/849* (2013.01); *H01L 2224/84138* (2013.01); *H01L 2224/84815* (2013.01); *H01L 2924/00014* (2013.01)

(Continued)

(58) Field of Classification Search
CPC ....... H01L 24/13; H01L 24/73; H01L 24/40; H01L 24/37; H01L 24/29; H01L 24/48; H01L 24/77; H01L 24/75; H01L 24/84; H01L 24/49; H01L 24/83; H01L 24/32
See application file for complete search history.

(56) References Cited

U.S. PATENT DOCUMENTS 4,445,274 A * 5/1984 Suzuki et al. .................. 29/832
5,029,529 A * 7/1991 Mandigo et al. .......... 102/202.9

(Continued)

FOREIGN PATENT DOCUMENTS

JP           05021683  A  *  1/1993
JP        2008-206363      9/2008

*Primary Examiner* — Jarrett Stark
(74) *Attorney, Agent, or Firm* — Mori & Ward, LLP

(57) ABSTRACT

A power converter includes a bus bar, a semiconductor device, a lead, and solder. The bus bar has a vertical wall. The semiconductor device includes an electrode. The lead has one end connected to the bus bar and another end connected to the semiconductor device to supply power from the bus bar to the electrode of the semiconductor device via the lead. The one end of the lead includes a bending part which is spaced away from the bus bar by a predetermined distance and which is inclined in a vertical downward direction. The vertical wall of the bus bar and the bending part are bonded to each other via the solder. The vertical wall extends in a substantially vertical direction to face the bending part.

16 Claims, 5 Drawing Sheets

(56) References Cited

U.S. PATENT DOCUMENTS

| | | | |
|---|---|---|---|
| 6,043,430 A * | 3/2000 | Chun | 174/530 |
| 6,252,299 B1 * | 6/2001 | Masuda et al. | 257/686 |
| 6,423,907 B1 * | 7/2002 | Haba et al. | 174/261 |
| 2001/0054762 A1 * | 12/2001 | Yamazaki et al. | 257/723 |
| 2003/0151128 A1 * | 8/2003 | Kawaguchi | 257/691 |
| 2006/0055011 A1 * | 3/2006 | Carney et al. | 257/676 |

* cited by examiner

POWER CONVERTER

CROSS-REFERENCE TO RELATED APPLICATIONS

The present application claims priority under 35 U.S.C. §119 to Japanese Patent Application No. 2013-61255, filed Mar. 25, 2013, entitled "Power Converter." The contents of this application are incorporated herein by reference in their entirety.

BACKGROUND

1. Field

The present disclosure relates to a power converter.

2. Description of the Related Art

A known conventional power converter supplies power to a motor for driving, which is used in an electric vehicle or a hybrid vehicle. For example as disclosed in Japanese Unexamined Patent Application Publication No. 2008-206363, in such a power converter, a set of a transistor electrode and a diode electrode is disposed symmetrically with respect to a bus bar as a center, the transistor electrode and the diode electrode are electrically connected to both ends of the bus bar by solder, and a control electrode and a circuit substrate, which are disposed adjacent to the transistor electrode, are electrically connected by a signal line bus bar. The signal line bus bar has a bus bar part which is in contact with the lower surface of the circuit substrate extending horizontally, a bond part which is in contact with the control electrode disposed approximately parallel to the circuit substrate, and a lead part which extends vertically to connect between the bus bar part and the bond part.

In addition, the bus bar part and the circuit substrate are bonded by solder with vertically stacked, the bond part and the control electrode are bonded by solder with vertically stacked, and power is thereby supplied from the circuit substrate to the control electrode through the bus bar.

SUMMARY

According to one aspect of the present invention, a power converter includes a bus bar, a semiconductor device, a lead, and solder. The bus bar has a vertical wall. The semiconductor device includes an electrode. The lead has one end connected to the bus bar and another end connected to the semiconductor device to supply power from the bus bar to the electrode of the semiconductor device via the lead. The one end of the lead includes a bending part which is spaced away from the bus bar by a predetermined distance and which is inclined in a vertical downward direction. The vertical wall of the bus bar and the bending part are bonded to each other via the solder. The vertical wall extends in a substantially vertical direction to face the bending part. A bond angle is formed between the bending part and the vertical wall being set to an acute angle in a cross-section perpendicular to the vertical wall.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
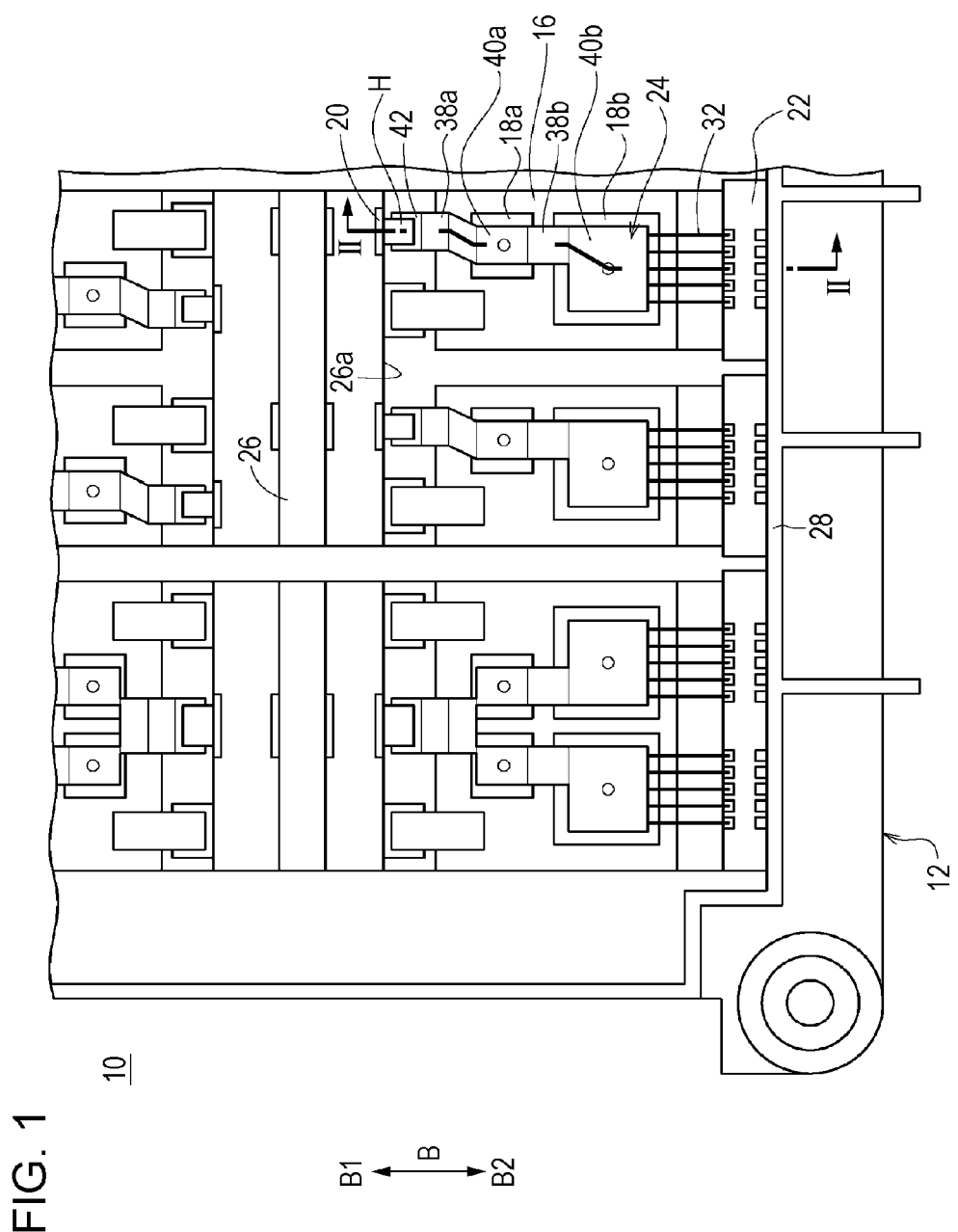
FIG. 1 is a partial plan view of a power converter according to an embodiment of the present disclosure.

The embodiments will now be described with reference to the accompanying drawings, wherein like reference numerals designate corresponding or identical elements throughout the various drawings.

A preferred embodiment of a power converter according to the present disclosure will be described in detail below with reference to the accompanying drawings. In FIG. 1, a reference symbol 10 indicates the power converter according to the embodiment of the present disclosure.

Figure 2:
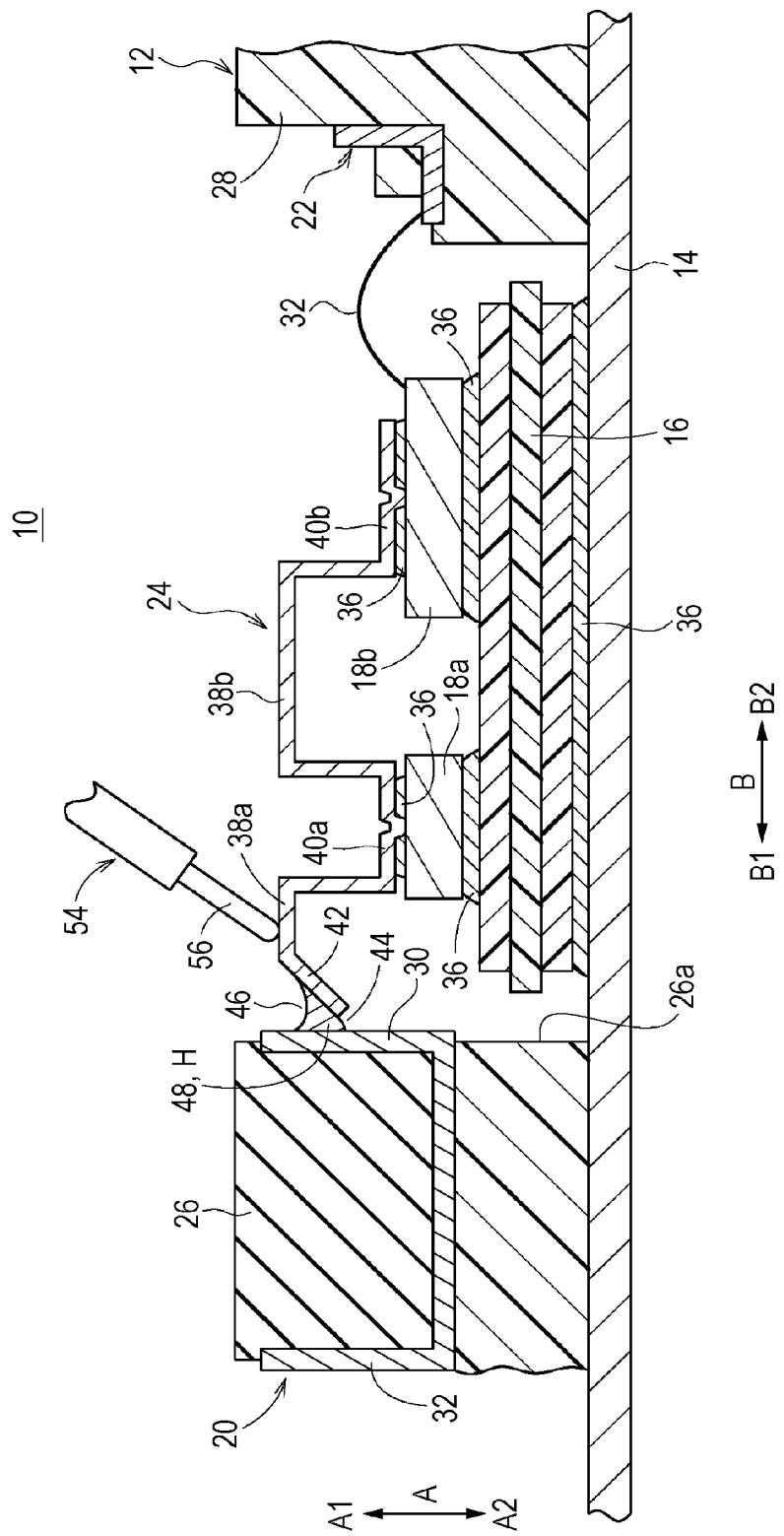
FIG. 2 is a cross-sectional view taken along line II-II of FIG. 1.

The power converter 10 is an inverter device for driving a drive motor which is used in an electric vehicle or a hybrid vehicle, for example. As illustrated in FIGS. 1 and 2, the power converter 10 includes a casing 12 made of resin material, a heat sink 14 provided below the casing 12, a circuit substrate 16 housed inside the casing 12, a plurality of semiconductor chips 18a, 18b mounted on the upper surface of the circuit substrate 16, first and second bus bars 20, 22 molded to the casing 12, and a connection lead (lead) 24 that connects the semiconductor chips 18a, 18b to the first bus bar (bus bar) 20.

The casing 12 includes, at its central portion, an insulating part 26 extending in the width direction and having a rectangular cross section, and a side part 28 spaced by a predetermined distance away from and approximately parallel to the insulating part 26. The first bus bar 20 is integrally molded with the insulating part 26 and the second bus bar 22 is integrally molded with the side part 28.

The heat sink 14, which is formed in a plate shape and made of metal material such as aluminum or copper, is provided below the lower surface of the casing 12, and the lower surface is covered with the heat sink 14. The heat sink 14 is provided for the purpose of dissipating heat to the outside, the heat being generated from the semiconductor chips 18a, 18b provided above the upper surface of the heat sink 14.

As illustrated in FIG. 2, the first bus bar 20 is formed of, for example, a metal material in a cross-sectional U-shape opening upward (the direction of arrow A1), and is arranged linearly along the insulating part 26 of the casing 12, and a pair of vertical walls 30, which is on the side of side walls 26a of the insulating part 26, is exposed to the outside with respect to the insulating part 26. It is to be noted that each side wall 26a and each vertical wall 30 are each a vertical surface approximately perpendicularly to the heat sink 14.

The second bus bar 22 is formed of a metal material in a cross-sectional L-shape, and is arranged linearly along the side part 28 of the casing 12. One end of the second bus bar 22 extending horizontally toward the first bus bar 20 (the direction of arrow B1) is electrically connected to the semiconductor chip 18b by a bonding wire 32.

The first and second bus bars 20, 22 are directly electrically connected to a DC power supply such as a battery via a cable (not illustrated).

The circuit substrate 16 is provided between the insulating part 26 and the side part 28 in the casing 12. The circuit substrate 16 is installed above the upper surface of the heat sink 14 with a solder 36 interposed therebetween, and is provided approximately parallel to the heat sink 14. The plurality of semiconductor chips 18a, 18b, in which, for example, transistor electrodes and diode electrodes (not illustrated) are formed, is disposed on the upper surface of the circuit substrate 16, and the circuit substrate 16 and the semiconductor chips 18a, 18b are electrically connected to each other via the solder 36 which is applied to the lower surfaces of the semiconductor chips 18a, 18b. It is to be noted that the semiconductor chips 18a, 18b are disposed so as to be spaced away from each other by a predetermined distance.

The connection lead 24 is formed of a metal material in a thin plate shape, for example, and includes a set of horizontal parts 38a, 38b extending horizontally (the direction of arrow B), a set of chip connecting parts 40a, 40b which project to be offset in the vertical downward direction (the direction of arrow A2) with respect to the horizontal parts 38a, 38b, and a bending part 42 which is formed at one end (in the direction of arrow B1) of the connection lead 24 and is bent at a predetermined angle with respect to the one horizontal part 38a. The connection lead 24 is formed, for example, by stamping a plate material having a certain thickness, and is disposed between the insulating part 26 and the side part 28 in the casing 12.

The horizontal parts 38a, 38b are each formed to have a predetermined length and to be spaced away from each other by a predetermined distance in the longitudinal direction (the direction of arrow B) of the connection lead 24. The horizontal parts 38a, 38b are provided approximately parallel to the circuit substrate 16 and the semiconductor chips 18a, 18b.

The chip connecting parts 40a, 40b are each formed in a planar shape which is approximately parallel to the horizontal parts 38a, 38b. One chip connecting part 40a is formed in a cross-sectional U-shape and provided between the horizontal part 38a and the horizontal part 38b, and the other chip connecting part 40a is formed in a cross-sectional L-shape and provided near the other end (in the direction of arrow B2) of the horizontal part 38b. The chip connecting parts 40a, 40b are then connected via the solder 36 to the semiconductor chips 18a, 18b with the chip connecting parts 40a, 40b in contact with the respective upper surfaces of the semiconductor chips 18a, 18b. Consequently, the chip connecting parts 40a, 40b of the connection lead 24 and the semiconductor chips 18a, 18b are electrically connected to each other.

Figure 3:
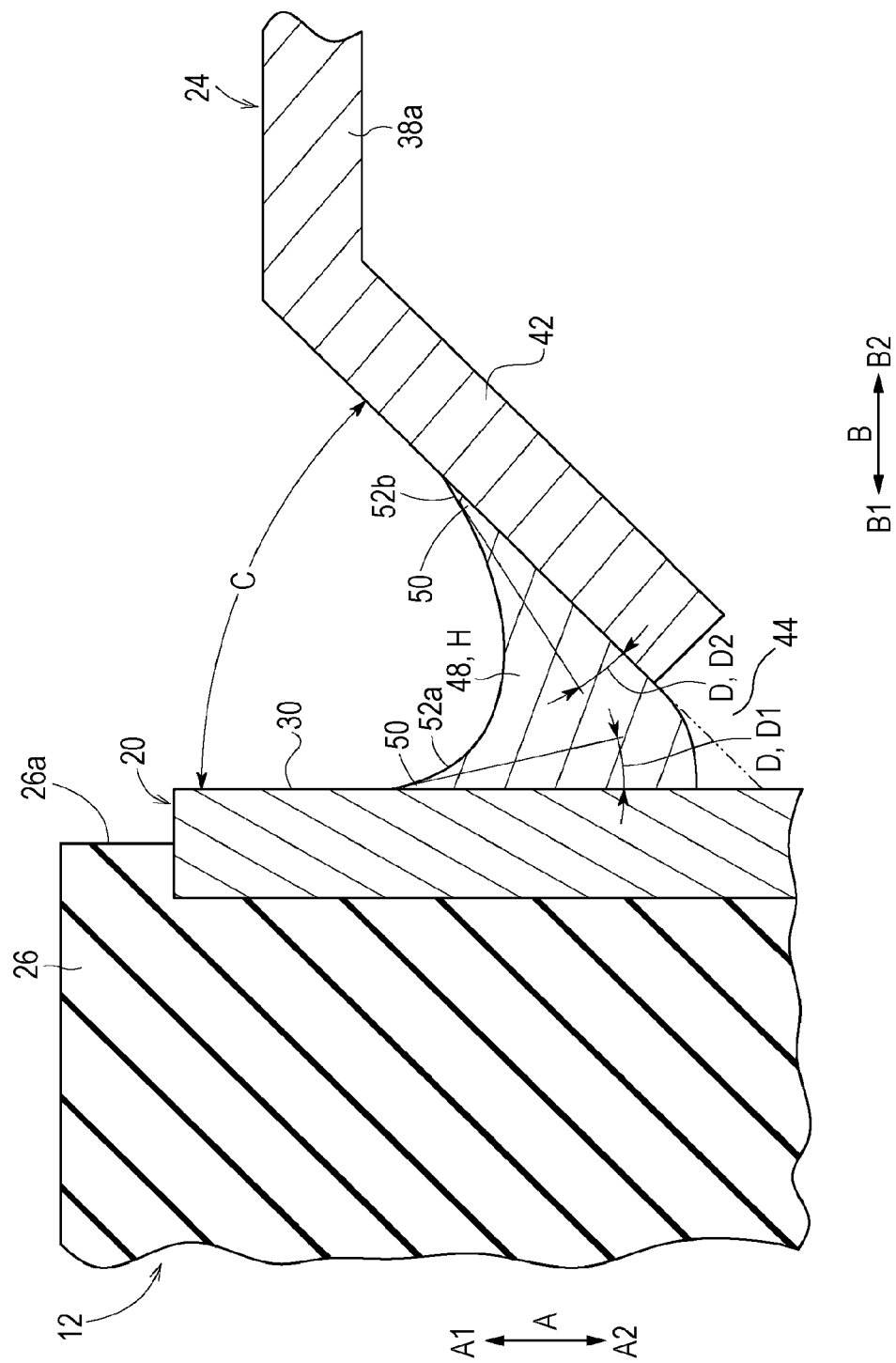
FIG. 3 is an enlarged cross-sectional view illustrating the vicinity of a bond part between a first bus bar and a connection lead in the power converter of FIG. 2.
Figure 4:
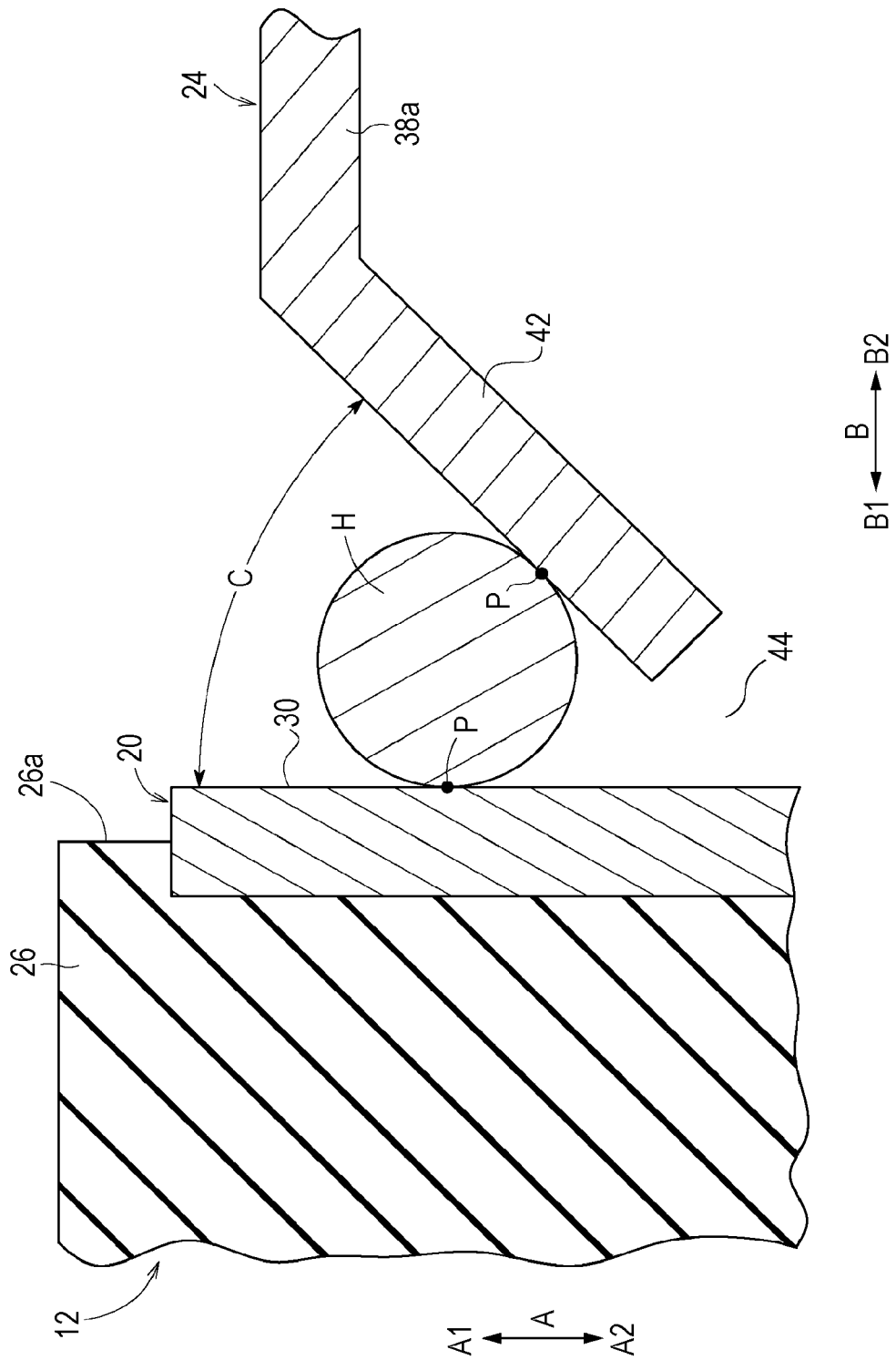
FIG. 4 is an enlarged cross-sectional view illustrating the vicinity of the bond part between the first bus bar and the connection lead of FIG. 3 before bonding.

As illustrated in FIGS. 2 to 4, the bending part 42 is formed by bending one end of the horizontal part 38a by a predetermined angle in the direction (the direction of arrow A2) in which the chip connecting parts 40a, 40b project, and is disposed to face the insulating part 26 (in the direction of arrow B1). In the connection lead 24, the bending part 42 is disposed so as to face the vertical wall 30 of the first bus bar 20 and a gap 44 is provided between the bending part 42 and the vertical wall 30 with the set of chip connecting parts 40a, 40b connected to the respective semiconductor chips 18a, 18b. Specifically, the end of the bending part 42 is disposed near the approximate center of the vertical wall 30 in its extending direction (see FIGS. 3 and 4).

The gap 44 is formed with a predetermined distance in the horizontal direction (the direction of arrow B) perpendicular to the vertical wall 30, and the size of the gap 44 is set based on the total of the maximum dimensional tolerances of the first bus bar 20 and the connection lead 24 in the horizontal direction.

That is, the gap 44 is provided with a non-contact distance even when the first bus bar 20 and the connection lead 24 are located closer to each other than normal due to a dimensional variation at the time of manufacture.

A bond angle C formed by the vertical wall 30 of the first bus bar 20 and the bending part 42 is set to an acute angle as illustrated in FIGS. 3 and 4.

A space 46 between the bending part 42 and the vertical wall 30 of the first bus bar 20 is formed in an approximately triangular cross-sectional shape which is gradually tapered downward (in the direction of arrow A2) and in which a bond part 48 which includes melted solder H is formed.

In the space 46, the bond part 48 is formed in an approximately triangular cross-sectional shape in contact with the first bus bar 20 and the bending part 42 of the connection lead 24, and heating to melt the solder H and solidifying it later allows the bonding part 42 and the first bus bar 20 to be electrically connected.

In the bond part 48, fillets 52a, 52b, which are depressed toward the first bus bar 20 and the connection lead 24 in a cross-sectional arc shape, are formed at contact ends 50 of the first bus bar 20 and the connection lead 24.

In addition, in the bond part 48, wetting angles D (contact angle) are set to be less than 90° (D<90°), the wetting angles D being formed by tangents drawn at the surfaces of the contact ends 50 and the surfaces (contact surfaces) of the first bus bar 20 and the connection lead 24.

The power converter 10 according to the embodiment of the present disclosure is basically configured as described above. Next, the case will be described where the connection lead 24 is bonded to the first bus bar 20 by heating the power converter 10 using a continuous furnace of a horizontal transportation type. In the following, a description will be given in a preparatory state where the heat sink 14 is mounted on the bottom surface of the casing 12, the circuit substrate 16 is placed above the upper surface of the heat sink 14 with the solder 36 interposed therebetween, and the plurality of semiconductor chips 18a, 18b is placed above the upper surface of the circuit substrate 16 with the solder 36 applied to the upper surface, interposed therebetween. The first bus bar 20 is previously molded to the insulating part 26 of the casing 12, and the vertical wall 30 is exposed to the side.

In the preparatory state, the chip connecting parts 40a, 40b of the connection lead 24 are respectively disposed above the upper surfaces of the semiconductor chips 18a, 18b with the solder 36 interposed therebetween, and the bending part 42 is disposed so as to face the vertical wall 30 of the first bus bar 20. In the above step, the connection lead 24 is disposed such that the gap 44 having a predetermined distance is provided between the end of the bending part 42 and the vertical wall 30 of the first bus bar 20.

Next, as illustrated in FIG. 4, a cylindrical solder H is placed in the approximately triangular cross-sectional space 46 which is formed by the vertical wall 30 of the first bus bar 20 and the bending part 42, and thus the outer circumferential surface of the solder H is held in line contact with the vertical wall 30 and the bending part 42. In other words, the solder H is held by two lines on the vertical wall 30 and the bending part 42. It is to be noted that the solder H to be used is not limited to a cylindrical shape having a circular cross section as described above.

After the connection lead 24 is disposed at a predetermined position in this manner, reflow process is performed such that the power converter 10 is transported along a transport path of a continuous furnace (not illustrated) to be heated. In the continuous furnace, heaters are provided, for example, at upper and lower positions with respect to the transport path, and the power converter 10 as a workpiece is moved along the transport path and is thereby heated up to a predetermined temperature by the heaters so that the solder H and the solder 36 start to be melted.

Thus, the solder H provided in the space 46 is melted and liquefied, then flows downward (in the direction of arrow A2) along the vertical wall 30 of the first bus bar 20 and the bending part 42 due to its own weight caused by gravitational force, and is formed in an approximately triangular cross-sectional shape so as to fill part of the space 46. The fillets 52a, 52b, which are concaved toward the vertical wall 30 and the bending part 42 in a cross-sectional arc shape, are formed at the contact ends 50 of the vertical wall 30 and the bending part 42.

The fillets 52a, 52b are formed based on contact points P (see FIG. 4) between the outer circumferential surface of the solder H before melting and the vertical wall 30, the bending part 42, and are created by the surface tension generated between liquefied solder H and the adjacent vertical wall 30, the bending part 42. At the same time, the solder 36 provided in the upper surface and the lower surface of the semiconductor chips 18a, 18b is melted.

The power converter 10 is then transported from the continuous furnace to the outside to be taken along the transport path, and is gradually cooled so that the solder 36 and the solder H are solidified. In this manner, due to the bond part 48 which is formed with the solidified solder H, the first bus bar 20 and the bending part 42 of the connection lead 24 are bonded and electrically connected together, and the solidification of the solder 36 allows the semiconductor chips 18a, 18b to be mounted and electrically connected to the circuit substrate 16 and the chip connecting parts 40a, 40b of the connection lead 24, respectively.

Consequently, the connection lead 24 is electrically connected to the first bus bar 20, and is further electrically connected to the plurality of semiconductor chips 18a, 18b via the chip connecting parts 40a, 40b, respectively. It is to be noted that the semiconductor chips 18a, 18b are electrically connected to the second bus bar 22 by the bonding wire 32.

In the preparatory state before the above-described reflow process is performed, when the connection lead 24 is disposed with respect to the first bus bar 20, the vertical wall 30 of the first bus bar 20 and the connection lead 24 each may not be at a predetermined position and may be misaligned in a relative positional relationship due to a dimensional variation (manufacturing variation) in each of the first bus bar 20, the casing 12 in which the first bus bar 20 is provided, and the connection lead 24.

For example, in the case where the connection lead 24 and the first bus bar 20 are misaligned in the horizontal direction (the direction of arrow B), and the bending part 42 is disposed at a position near or away from the first bus bar 20 with respect to a predetermined position, the size of the gap 44 between the connection lead 24 and the first bus bar 20 is changed, and the solder H melted in the space 46 flows, thereby filling the space between the bending part 42 and the vertical walls 30 favorably. Therefore, a horizontal positional gap between the first bus bar 20 and the connection lead 24 may be adjusted and reliable bonding therebetween is achieved.

In the case where the first bus bar 20 and the connection lead 24 are relatively misaligned in the vertical direction (the direction of arrow A) due to the above-described dimensional variation, the spacing distance (the gap 44) between the vertical wall 30 and the bending part 42 of the connection lead 24 is not changed due to the configuration in which the vertical wall 30 of the first bus bar 20 extends in the vertical direction, and thus the solder H melted in the space 46 allows the first bus bar 20 and the connection lead 24 to be reliably bonded to each other.

That is, even when the first bus bar 20 and the connection lead 24 are misaligned with respect to a predetermined position due to a dimensional variation, reliable bonding therebetween may be achieved by easily coping with the dimensional variation in each of the horizontal direction (the direction of arrow B) and the vertical direction (the direction of arrow A).

Lastly, after the first bus bar 20 and the connection lead 24 are bonded to each other as described above, and the first bus bar 20 and the semiconductor chips 18a, 18b, the circuit substrate 16 are electrically connected via the connection lead 24, the connection state is inspected by an inspection probe 54 (see FIG. 2) of a substrate inspection device.

The inspection probe 54 has a contact pin 56 contactable to a current carrying portion. Electrical inspection for the power converter 10 including the connection lead 24 is conducted by having the contact pin 56 come in contact with the horizontal part 38a of the connection lead 24 from an upper position, then by supplying current and voltage from the substrate inspection device to the contact pin 56. When an electrical inspection is conducted in this manner, utilizing the planarly formed horizontal part 38a of the connection lead 24 and having the contact pin 56 come in contact with the horizontal part 38a allows inspection work to be performed easily and reliably.

It is to be noted that the horizontal part 38a for contacting the inspection probe 54 is not limited to the case where the horizontal part 38a is formed at the uppermost position (in the direction of arrow A1) adjacent to the bending part 42 as in the connection lead 24 described above, and may be formed, for example, at a lower position (in the direction of arrow A2) with respect to the end of the bending part 42. That is, as long as the horizontal part 38a is formed in a planar shape approximately parallel to the longitudinal direction (extending direction) of the connection lead 24, the position of the horizontal part 38a is not particularly limited.

Figure 5:
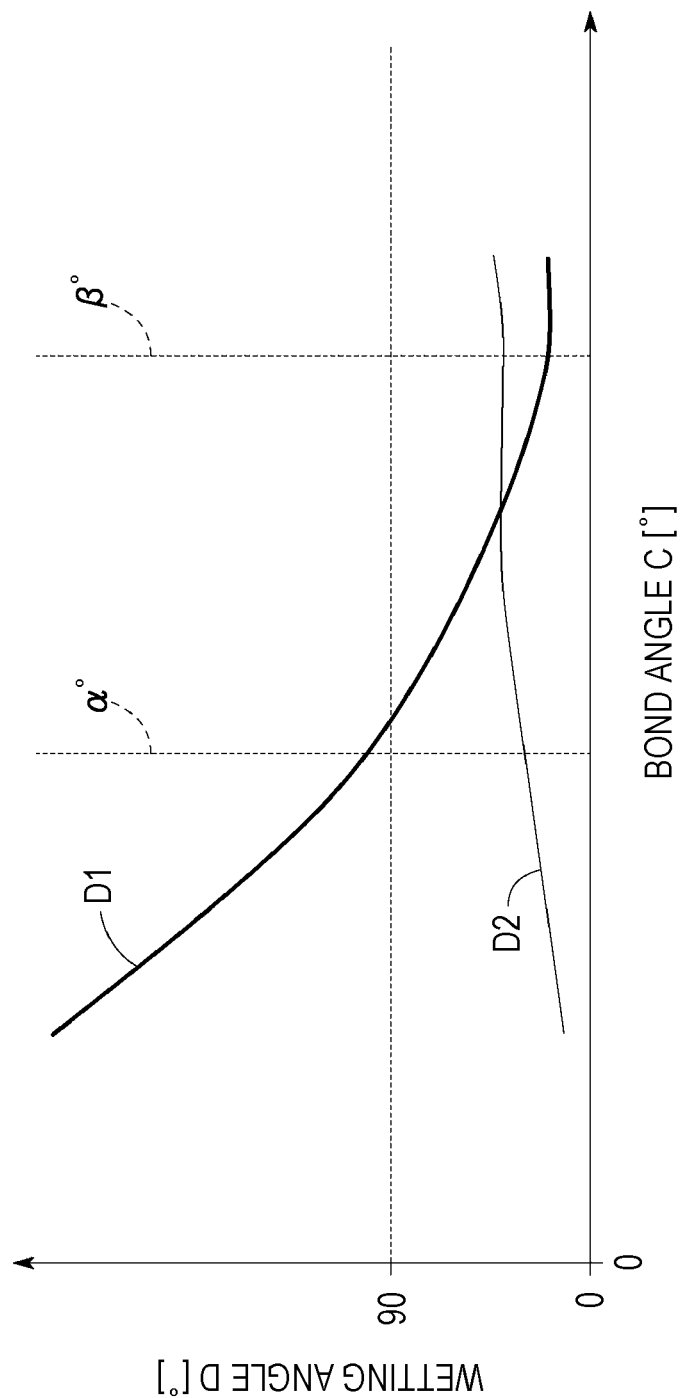
FIG. 5 is a characteristic curve graph illustrating the relationship between a bond angle and a wetting angle at the bond end, the bond angle being formed by the first bus bar and a bending part of the connection lead.

Next, the relationship between the bond angle C and the wetting angle D (D1, D2) at each contact end 50 of the solder H will be described with reference to the characteristic curve of FIG. 5, the bond angle C being formed by the first bus bar 20 and the bending part 42 of the connection lead 24. In FIG. 5, the characteristic of the wetting angle D1 near the first bus bar 20 is indicated by a thick solid line, and the characteristic of the wetting angle D2 near the connection lead 24 is indicated by a thin solid line.

As seen from FIG. 5, the wetting angle D1 formed by the vertical wall 30 of the first bus bar 20 and the contact end 50 of the solder H increases as the bond angle C decreases, and the wetting angle D1 gradually decreases as the bond angle C increases. That is, the wetting angle D2 of the fillet 52a formed near the first bus bar 20 has an inversely proportional relationship with the bond angle C.

On the other hand, the wetting angle D2 formed by the bending part 42 and the contact end 50 of the solder H is less than 90° (D2<90°) in a range of the bond angle C of 0 to 90° irrespective of the bond angle C which is formed by the first bus bar 20 and the connection lead 24.

The reason why the wetting angle D1 increases is that for example, when the bond angle C is less than or equal to α°, that is when the inclined angle of the bending part 42 with respect to the horizontal part 38a is large, the melted solder H flows downward (in the direction of arrow A2) at a higher speed due to its own weight, and accordingly, the wetting angle D1 of the solder H with respect to the first bus bar 20 forms an obtuse angle, and thus the fillet 52a is not formed. For this reason, the bonding state of the solder H for the first bus bar 20 may not be visually recognized with the fillet 52a.

On the other hand, for example when the bond angle C is set to be greater than or equal to β°, the wetting angle D1 near the first bus bar 20 and the wetting angle D2 near the connection lead 24 are both less than 90°, and the open cross-sectional area above the space 46 (in the direction of arrow A1) increases, and the solder H is thereby likely to splash upward when reflow process is performed by placing the solder H.

As a result, the bond angle C formed by the first bus bar 20 and the bending part 42 of the connection lead 24 is optimally set to an acute angle in a range of α° to β° (α°≤C≤β°) in consideration of forming the fillets 52a, 52b using the melted solder H and the workability of placing the solder H in the space 46. Thus, the downward flow speed of the melted solder H is reduced by the bending part 42 which is favorably inclined, and the fillets 52a, 52b having a desired angle are formed. Consequently, one end of the connection lead 24 is reliably bonded to the first bus bar 20 and the bonding state may be visually inspected by a worker easily, and thus the working efficiency of the bonding process may be improved.

As described above, in the present embodiment, one end of the connection lead 24 included in the power converter 10 is provided with the bending part 42 which is inclined by a predetermined angle with respect to the extending direction (the direction of arrow B) of the semiconductor chips 18a, 18b and the circuit substrate 16, the bending part 42 is disposed so as to face the vertical wall 30 of the first bus bar 20 which extends in the vertical direction (the direction of arrow A), and the first bus bar 20 and the connection lead 24 are bonded and electrically connected together by melting the solder H placed in the approximately triangular cross-sectional space 46 which is formed by the bending part 42 and the vertical wall 30.

Thus, for example when a dimensional variation occurs in the first bus bar 20 or the connection lead 24, and the bending part 42 is misaligned in the horizontal direction (the direction of arrow B) to change the gap 44 between the first bus bar 20 and the connection lead 24, the dimensional variation is favorably adjusted by the solder H melted in the space 46 and thus the first bus bar 20 and the connection lead 24 may be reliably bonded to each other. On the other hand, when the first bus bar 20 and the connection lead 24 are misaligned in the vertical direction (the direction of arrow A) due to the dimensional variation, the spacing distance between the first bus bar 20 and the connection lead 24 is not changed because the vertical wall 30 extends in the vertical direction, and thus the first bus bar 20 and the connection lead 24 may be reliably bonded to each other via the solder H.

That is, even when the first bus bar 20 and the connection lead 24 are misaligned due to a dimensional variation, reliable bonding therebetween may be achieved by easily coping with the dimensional variation in each of the horizontal direction (the direction of arrow B) and the vertical direction (the direction of arrow A), and thus reliability may be improved by reducing a manufacturing variation in the power converter 10.

In other words, the first bus bar 20 and the one end (the bending part 42) of the connection lead 24 are disposed without being stacked in the vertical direction (the direction of arrow A), and thus even when misalignment occurs in the vertical direction due to a dimensional variation, the first bus bar 20 and the one end may be bonded to each other without increasing the amount of solder or pressing the connection lead 24 downward using a weight.

In addition, the moving speed of downward (in the direction of arrow A2) flow of the melted solder H along the vertical wall 30 and the bending part 42 due to its own weight caused by gravitational force may be reduced by setting the bond angle C to an acute angle, the bond angle C being formed by the vertical wall 30 of the first bus bar 20 and the bending part 42. Accordingly, the wetting angles D, D1, D2 (contact angles) of the fillets 52a, 52b formed with the solder H may be set to be less than 90° (D, D1, D2<90°).

Consequently, the fillets 52a and 52b may be formed for the vertical wall 30 of the first bus bar 20 and the bending part 42, respectively, and thus the bonding state between the first bus bar 20 and the connection lead 24 may be visually inspected by a worker easily and reliably by observing the bond part 48 having the fillets 52a, 52b.

In addition, the connection lead 24 has the horizontal part 38a formed in a planar shape between the bending part 42 formed at one end of the connection lead 24 and the chip connecting part 40a. Thus for example, when an electrical inspection is conducted after a process of bonding the connection lead 24 to the semiconductor chips 18a, 18b and the first bus bar 20 is completed, the pin-shaped contact pin 56 in the inspection probe 54 may be in contact with the horizontal part 38a with ease and the workability of the electrical inspection may be improved.

Furthermore, the approximately triangular cross-sectional space 46, which is formed by the first bus bar 20 and the bending part 42 of the connection lead 24, serves as a solder pool in which the solder H is trapped when the solder H is melted and flows downward (in the direction of arrow A2), and thus the solder H is made to come into close contact with the first bus bar 20 and the connection lead 24 in a larger area, thereby allowing reliable bonding therebetween.

Furthermore, the gap 44 having a predetermined distance is provided in the horizontal direction (the direction of arrow B) between the vertical wall 30 of the first bus bar 20 and the bending part 42 of the connection lead 24, and the gap 44 is set to be approximately equal to or greater than the total of the maximum dimensional tolerances of the first bus bar 20 and the connection lead 24 in the horizontal direction (the direction of arrow B). Therefore, even when the first bus bar 20 and the connection lead 24 are misaligned in a direction so as to be closer to each other due to a dimensional variation, mutual contact therebetween is favorably avoided.

The power converter according to the present disclosure is not limited to the above-described embodiment, and various configurations may be adopted without departing from the spirit of the present disclosure.

The present disclosure provides a power converter which includes a lead having one end connected to a bus bar and the other end connected to a semiconductor device, and which supplies power from the bus bar to an electrode of the semiconductor device via the lead. One end of the lead includes a bending part which is spaced away from the bus bar by a predetermined distance and inclined in a vertical downward direction, a vertical wall of the bus bar and the bending part are bonded to each other via solder, the vertical wall extending in a vertical direction to face the bending part, and a bond angle formed by the bending part and the vertical wall is set to an acute angle in a cross-section perpendicular to the vertical wall.

According to the present disclosure, in a power converter in which one end of a lead is connected to a bus bar and the other end is connected to a semiconductor device, the end of the lead is provided with a bending part which is spaced away from the bus bar by a predetermined distance and inclined in the vertical downward direction, a vertical wall of the bus bar and the bending part are bonded to each other via solder, the vertical wall extending in the vertical direction to face the bending part, and the bond angle formed by the bending part and the vertical wall is set to an acute angle in a cross-section perpendicular to the vertical wall.

Thus, in the case where a dimensional variation occurs in the bus bar or the lead and vertical misalignment occurs in a mutual relative positional relationship, the spacing distance between the vertical wall of the bus bar and the lead is not changed and reliable bonding therebetween may be achieved via solder, and even when horizontal misalignment occurs, the variation may be adjusted by the solder which bonds the vertical wall and the bending part to each other.

Consequently, even when the bus bar and the lead are misaligned due to a dimensional variation, the dimensional variation in the vertical direction and the horizontal direction may be favorably adjusted and reliable bonding may be achieved, and accordingly, the reliability of the power converter may be improved.

In addition, by setting the wetting angle formed by the bus bar and the contact end of the solder to an acute angle, a fillet is formed between the contact end and the bus bar when the solder is melted and flows between the bus bar and the lead, and thus the bonding state may be visually inspected with the fillet. Consequently, the bonding state between the bus bar and the lead may be inspected easily and reliably.

In addition, the bond angle and the wetting angle preferably have a correlation that the measure of the wetting angle is decreased as the measure of the bond angle which is acute is increased. Consequently, by reducing the wetting angle to within the range of an acute angle, a fillet is formed at the contact end of the solder, and thus the bonding state between the bus bar and the lead may be visually inspected with the fillet.

Furthermore, the lead has a horizontal part at a portion of one end opposite to the bending part, the horizontal part extending in the extending direction of the lead, and thus when an electrical inspection is conducted after bonding between the lead and the bus bar is completed, the inspection probe may be in contact with the horizontal part with ease and the workability of the electrical inspection may be improved.

Furthermore, a gap having a predetermined distance is provided between the bending part and the vertical wall in the horizontal direction perpendicular to the extending direction of the vertical wall, and thus even when the first bus bar and the lead are misaligned in a direction so as to be closer to each other due to a dimensional variation, contact therebetween is favorably avoided.

Obviously, numerous modifications and variations of the present invention are possible in light of the above teachings. It is therefore to be understood that within the scope of the appended claims, the invention may be practiced otherwise than as specifically described herein.

What is claimed is:

1. A power converter comprising:
a bus bar having a vertical wall;
a semiconductor device having an upper surface and a vertical direction substantially perpendicular to the upper surface, the semiconductor device including an electrode;
a lead having one end connected to the vertical wall of the bus bar and another end connected to the semiconductor device to supply power from the bus bar to the electrode of the semiconductor device via the lead, the one end of the lead including a bending part which is spaced away from the vertical wall of the bus bar by a predetermined distance and which is inclined in the vertical direction; and
solder in direct contact with the vertical wall of the bus bar to bond the vertical wall of the bus bar and the bending part, the vertical wall extending in the vertical direction to face the bending part, a bond angle formed between the bending part and the vertical wall being set to an acute angle in a cross-section perpendicular to the vertical wall and the upper surface of the semiconductor device, the acute angle being an angle of greater than zero degrees.

2. The power converter according to claim 1, wherein a wetting angle formed between the bus bar and a contact end of the solder is set to an acute angle.

3. The power converter according to claim 2, wherein the bond angle and the wetting angle have a correlation that a measure of the wetting angle is decreased as a measure of the bond angle which is acute is increased.

4. The power converter according to claim 1, wherein the lead has a horizontal part at a portion of the one end opposite to the bending part, the horizontal part extending in an extending direction of the lead.

5. The power converter according to claim 1, wherein a gap having a predetermined distance is provided between the bending part and the vertical wall in a substantially horizontal direction perpendicular to the vertical direction.

6. The power converter according to claim 5, wherein the gap is set based on a total of a maximum dimensional tolerance of the bus bar and the lead in the substantially horizontal direction perpendicular to the vertical direction.

7. The power converter according to claim 1, wherein an end of the bending part is provided near an approximate center of the vertical wall in the vertical direction of the vertical wall.

8. A power converter according to claim 1, wherein the solder forms a bridge between the vertical wall of the bus bar and the bending part in a direction substantially orthogonal to the vertical direction.

9. A power converter according to claim 1, wherein the one end of the lead including the bending part is spaced away from the bus bar by the predetermined distance in a horizontal direction that is substantially orthogonal to the vertical direction.

10. A power converter according to claim 1, wherein the bending part and the vertical wall define a gap, the gap having an approximately triangular cross-sectional shape between the bending part and the vertical wall.

11. A power converter according to claim 1, wherein the solder directly contacts the bending part.

12. A power converter according to claim 1, wherein the solder is disposed between the vertical wall and the bending part.

13. A power converter according to claim 1, wherein the bending part is spaced away from the bus bar and inclined in the vertical direction relative to the vertical wall so as to partially support the solder in the vertical direction when the solder is melted, the vertical direction being aligned with a direction of gravitational force when the solder is melted.

14. A power converter comprising:
a bus bar having a vertical wall;
a semiconductor device having an upper surface and a vertical direction substantially perpendicular to the upper surface, the semiconductor device including an electrode;
a lead having one end connected to the vertical wall of the bus bar and another end connected to the semiconductor device to supply power from the bus bar to the electrode of the semiconductor device via the lead, the one end of the lead including a bending part which is spaced away from the vertical wall of the bus bar by a predetermined distance to form a gap, the bending part being inclined in the vertical direction; and
solder in direct contact with the vertical wall of the bus bar to bond the vertical wall of the bus bar and the bending part, the vertical wall extending in the vertical direction to face the bending part, a bond angle formed between the bending part and the vertical wall being set to an acute angle in a cross-section perpendicular to the vertical wall and the upper surface of the semiconductor device, the acute angle being an angle of greater than zero degrees,
wherein the solder is disposed in the gap such that the is held in contact with the vertical wall and the bending part such that the gap serves as a solder pool in which solder is trapped when the solder is melted.

15. A power converter according to claim 14, wherein the gap has an approximately triangular cross-sectional shape.

16. A power converter according to claim 14, wherein the bending part is spaced away from the bus bar and inclined in the vertical direction relative to the vertical wall so as to partially support the solder in the vertical direction when the solder is melted, the vertical direction being aligned with a direction of gravitational force when the solder is melted.

* * * * *